United States Patent
Pietranera et al.

(10) Patent No.: US 9,972,764 B2
(45) Date of Patent: May 15, 2018

(54) CONTINUOUS BRAZING SYSTEM AND BRAZING PROCESS

(71) Applicant: Columbus Superconductors S.P.A., Genoa (IT)

(72) Inventors: Davide Pietranera, Genoa (IT); Riccardo Valle, Chiavari (IT); Riccardo Morgavi, Genoa (IT)

(73) Assignee: Columbus Superconductors S.P.A., Genoa (IT)

( * ) Notice: Subject to any disclaimer, the term of this patent is extended or adjusted under 35 U.S.C. 154(b) by 0 days. days.

(21) Appl. No.: 15/029,233

(22) PCT Filed: Oct. 16, 2014

(86) PCT No.: PCT/IB2014/065355
§ 371 (c)(1),
(2) Date: Apr. 13, 2016

(87) PCT Pub. No.: WO2015/056199
PCT Pub. Date: Apr. 23, 2015

(65) Prior Publication Data
US 2016/0260884 A1    Sep. 8, 2016

(30) Foreign Application Priority Data

Oct. 16, 2013   (IT) .............................. PD2013A0284

(51) Int. Cl.
*B23K 37/00*   (2006.01)
*H01L 39/24*   (2006.01)
(Continued)

(52) U.S. Cl.
CPC ........ *H01L 39/2403* (2013.01); *B23K 1/0008* (2013.01); *B23K 3/063* (2013.01);
(Continued)

(58) Field of Classification Search
CPC ............ H01L 39/2403; H01L 39/2487; B23K 1/0008; B23K 2201/38; B23K 1/19; B23K 3/063; B23K 2201/32
(Continued)

(56) References Cited

U.S. PATENT DOCUMENTS 3,745,631 A * 7/1973 Jonason ................. B21D 53/04
228/235.2
4,537,642 A * 8/1985 Saito .................... H01L 39/2403
148/96
(Continued)

FOREIGN PATENT DOCUMENTS

EP            0482747        4/1992
JP       2008-060074 A *    3/2008
(Continued)

*Primary Examiner* — Kiley Stoner
(74) *Attorney, Agent, or Firm* — Stetina Brunda Garred & Brucker (57) ABSTRACT

A brazing system (1) for manufacturing an armored superconductor wire (10, 10a) comprises: —a first feeder (5) of a superconductor wire (11), —a second feeder (6) of a conductor wire (12), a layer (13) of brazing alloy being applied to a first face (12a) of the conductor wire (12), —an aligning device (8) for approaching the superconductor wire (11) to said first face (12a), —a furnace for melting the brazing alloy layer (13), —a collimator (15), comprising: —at least one first plurality of rolls (17) rotatable about respective first rotation axes (Y) orthogonal to said axial direction (X) to compress said assembly in direction orthogonal to said first face (12a), —at least one second plurality of rolls (18) rotatable about respective second rotation axes (Z) orthogonal to the axial direction (X) and to the first rotation axes (Y) to compress the sides of the assembly, —cooling means (25) downstream of the rolls (17, 18) to solidify the brazing alloy layer (13).

9 Claims, 5 Drawing Sheets (51) Int. Cl.
   *B23K 3/06* (2006.01)
   *B23K 1/00* (2006.01)
   *B23K 101/32* (2006.01)
   *B23K 1/19* (2006.01)
   *B23K 101/38* (2006.01)

(52) U.S. Cl.
   CPC ............ H01L 39/2487 (2013.01); *B23K 1/19* (2013.01); *B23K 2201/32* (2013.01); *B23K 2201/38* (2013.01)

(58) Field of Classification Search
   USPC ..... 228/245–258, 41, 15.1–17.7, 158, 235.2, 228/235.3, 17
   See application file for complete search history.

(56) References Cited

U.S. PATENT DOCUMENTS

| | | | | |
|---|---|---|---|---|
| 4,759,487 A * | 7/1988 | Karlinski | ............ | G02B 6/4485 219/121.63 |
| 5,377,899 A * | 1/1995 | Hashimoto | ........ | B23K 35/0238 228/117 |
| 5,560,536 A * | 10/1996 | Moe | ................... | H01B 13/2633 228/102 |
| 5,796,065 A * | 8/1998 | Fujiyoshi | ............... | H01R 43/16 219/78.02 |
| 6,142,362 A * | 11/2000 | Maus | ....................... | B01J 35/04 228/181 |
| 6,497,029 B1 | 12/2002 | Quick et al. | | |
| 7,337,527 B2 * | 3/2008 | Grasso | ............. | C04B 35/58057 29/599 |
| 2004/0226163 A1 * | 11/2004 | Hentges | .............. | H01L 39/2403 29/599 |
| 2009/0173768 A1 * | 7/2009 | Shin | ....................... | B23K 35/40 228/17 |
| 2010/0173784 A1 * | 7/2010 | Lee | ....................... | H01L 39/143 505/237 |
| 2014/0274726 A1 * | 9/2014 | Sugimoto | ........... | H01L 39/2403 505/231 |
| 2014/0357495 A1 * | 12/2014 | Daibo | ....................... | H01F 6/06 505/211 |
| 2015/0174678 A1 * | 6/2015 | Sato | ..................... | B23K 3/0676 428/645 |
| 2016/0039032 A1 * | 2/2016 | Vornbrock | ............... | B23K 1/08 228/259 |
| 2016/0079458 A1 * | 3/2016 | Endo | ................. | H01L 31/02008 136/244 |
| 2016/0141080 A1 * | 5/2016 | Otto | ...................... | H01L 39/248 505/230 |
| 2016/0158898 A1 * | 6/2016 | Wiehl | .................... | B23K 35/28 148/528 |

FOREIGN PATENT DOCUMENTS

| | | |
|---|---|---|
| JP | 2011-014404 A * | 1/2011 |
| KR | 100755899 B1 * | 9/2007 |
| WO | WO0108234 | 2/2001 |
| WO | WO 2008/015941 A1 * | 7/2007 |

* cited by examiner

CONTINUOUS BRAZING SYSTEM AND BRAZING PROCESS

CROSS REFERENCE TO RELATED APPLICATIONS

The present application claims priority to PCT International Application No. PCT/IB2014/065355 filed on Oct. 16, 2014, which application claims priority to Italian Patent Application No PD2013A000284 filed Oct. 16, 2013, the entirety of the disclosures of which are expressly incorporated herein by reference.

STATEMENT RE: FEDERALLY SPONSORED RESEARCH/DEVELOPMENT

Not Applicable.

FIELD OF THE INVENTION

The present invention relates to a continuous brazing system for manufacturing an armored superconductor wire, comprising a superconductor portion and a conductor portion. The present invention also relates to a brazing process for manufacturing the aforesaid wire.

PRIOR ART

It is known to manufacture wires made of superconductor material, in particular of magnesium diboride ($MgB_2$).

Such wires are normally used in cryogenic conditions at temperatures of use typically comprised between 4 degrees Kelvin and 30 degrees Kelvin. The wire may loose its superconductor properties and behave like a conductor wire in case of a temperature increase above the expected temperature of use, even localized to a limited stretch of the superconductor wire, for example caused by a malfunctioning of the cryogenic system associated to the wire or a sudden increase of the circulating temperature. This may damage the superconductor wire itself because of the generated thermal energy.

In order to avoid such a drawback, a second conductor wire with good electric and/or thermal conductivity features, e.g. made of copper, is provided, coupled to the superconductor wire and placed in parallel thereto. Thus, if a sudden shift of the superconductor wire to simple conduction condition occurs, the electric current will tend to pass preventively across the copper conductor, thus preventing damage to the superconductor part. The conductor wire thus works as protection for the superconductor wire to which it is coupled.

It is consequently desirable to be able to have a system which allows to manufacture an armored superconductor comprising a superconductor portion and a conductor portion.

It is equally desirable for such a system to operate continuously receiving in input a conductor wire and a superconductor wire, coupling them to each other and outputting an armored wire comprising a superconductor portion and a conductor portion.

SUMMARY

According to a first aspect of the invention, the aforesaid technical problem is solved by means of a brazing system comprising:

a first feeder of a superconductor wire, a second feeder of a conductor wire, a layer of brazing alloy being applied to a first face of said conductor wire, an aligning device for approaching said superconductor wire to said first face of said conductor wire, so that said superconductor and conductor wires are aligned along a common longitudinal direction, a furnace for melting said brazing alloy layer, a collimator comprising:
   at least one first plurality of rolls rotatable about respective first rotation axes orthogonal to said axial direction to compress said superconductor and conductor wire assembly and said layer of molten brazing alloy in direction orthogonal to said first face of said conductor wire,
   at least one second plurality of rolls rotatable about respective first rotation axes orthogonal to said axial direction and to said first rotation axes to compress the sides of said superconductor and conductor wire assembly and said layer of molten brazing alloy in direction parallel to said first face of said conductor wire and orthogonal to the longitudinal direction,
   cooling means downstream of said plurality of rolls to remove heat from said superconductor and conductor wire assembly and said molten brazing alloy layer to obtain the solidification of said brazing alloy layer.

Advantageously, for the purposes of the present invention, the first and the second plurality of rolls compress the said superconductor and conductor wire assembly and said molten brazing alloy layer by means of the action of adjustable elastic elements, such as springs, for example.

The use of rotatable rolls orthogonal to each other and to the axial direction of advancement of the wire allow to obtain a final product having the desired section, in particular rectangular shaped, and an excellent alignment between superconductor wire and conductor wires. Furthermore, the cooling means allow to consolidate the brazing alloy, so that the armored wire downstream thereof is stable and can be handled, e.g. to be stored by winding on a supporting coil.

The system described above can be continuously operated at substantially constant linear advancement speed of the input wires and of the output wire.

Further advantages of the present invention can be obtained by means of the system obtained according to dependent claims. In particular, it is possible to divide the collimator into:

a first collimation group including said first and second plurality of rolls, a second collimation group downstream of said first collimation assembly, including:
   a third plurality of rolls arranged parallel to said first plurality of rolls to compress the superconductor and conductor wire assembly and said layer of molten brazing alloy in direction orthogonal to said first face of said conductor wire,
   a fourth plurality of rolls arranged parallel to said second plurality of rolls to compress the sides of said superconductor and conductor wire assembly and of said layer of molten brazing alloy in direction parallel to said first face of said conductor wire and orthogonal to said longitudinal direction,
   said cooling means.

In this manner, the first collimation group allows the perfect coupling between the two conductor and superconductor wires before the brazing layer is perfectly solidified, whereas the definitive consolidation of the brazing alloy, and thus of the end product, occurs in the second collimation group. Advantageously, it is further possible to use a coating made of conducting material for the rolls of the third and fourth plurality to facilitate the removal of heat.

In accordance with a second aspect of the invention, the aforesaid technical problem is also solved by means of a manufacturing process of an armored superconductor wire comprising the steps of:

moving a semiconductor wire according to a first axial direction of said superconductor wire,
   moving at least one conductor wire according to a second axial direction of said conductor wire, a layer of brazing alloy being applied to a first face of said conductor wire,
   approaching said superconductor wire to said first face of said conductor wire, so that said superconductor and conductor wires are aligned along common axial direction,
   melting said brazing alloy layer,
   compressing the bases of said superconductor and conductor wire assembly and of said layer of molten brazing alloy in direction orthogonal to said first face of said conductor wire,
   compressing the sides of said superconductor and conductor wire assembly and of said layer of molten brazing alloy in a direction parallel to said first face of said conductor wire and orthogonal to the longitudinal direction,
   cooling said superconductor and conductor wire assembly and said layer of molten brazing alloy and obtaining the solidification of said brazing alloy layer.

Such a method allows to obtain the same advantages described above with reference to the system which can be obtained by means of the present invention.

BRIEF DESCRIPTION OF THE FIGURES

Further features and advantages of the present invention will be more apparent in the following detailed description of a preferred embodiment, by way of non-exclusive indicative, non-limitative example, with reference to the accompanying drawings, in which:

FIGS. 1b is and 2 are two section views of two respective variants of the superconductor wire in FIG. 1;

DETAILED DESCRIPTION OF THE INVENTION

Figure 1:
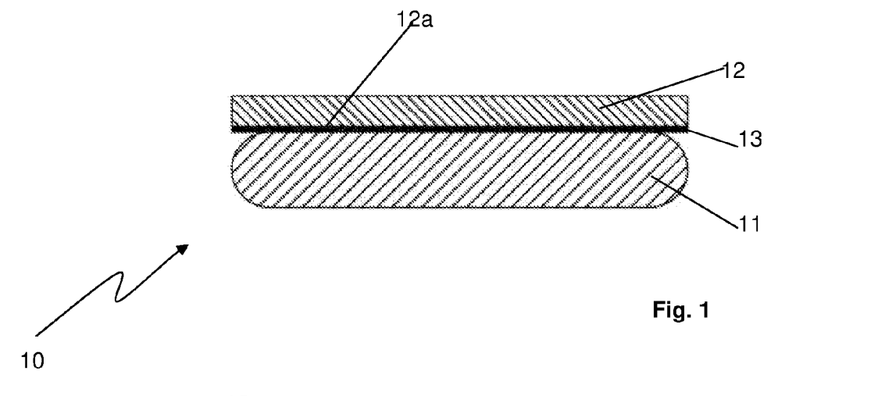
FIG. 1 is a section view of an armored superconductor wire which can be obtained by means of the system and the method of the present invention.
Figure 2:
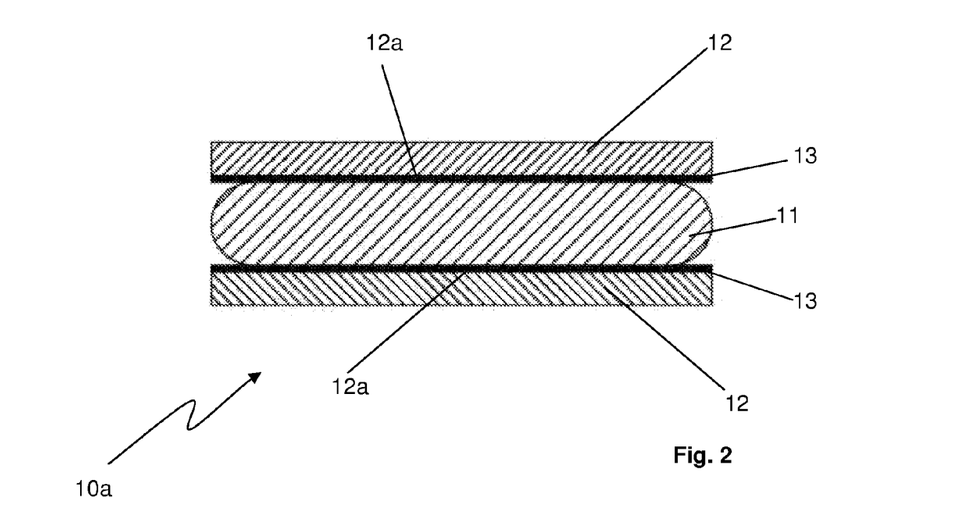
Figure 3:
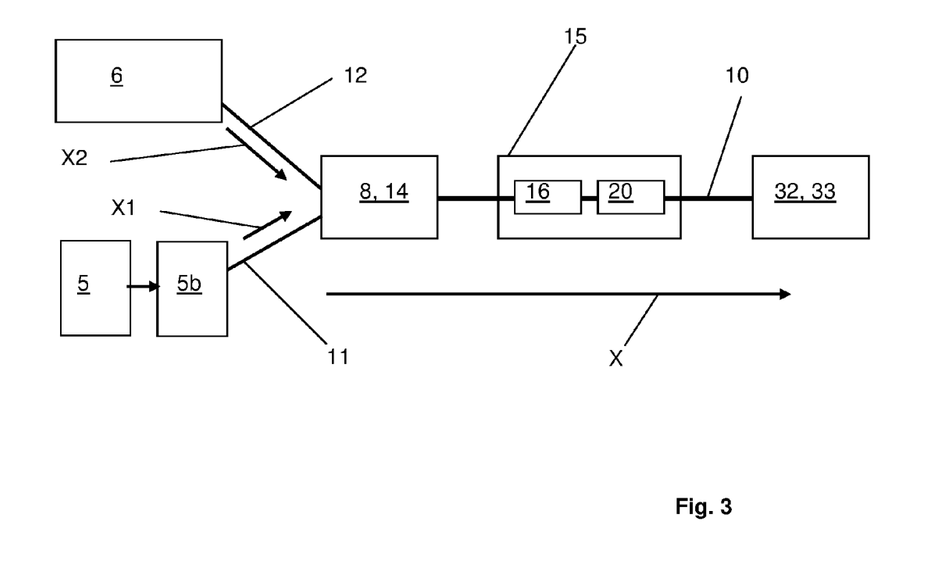
FIG. 3 is a diagrammatic block view of a system according to the present invention.
Figure 4:
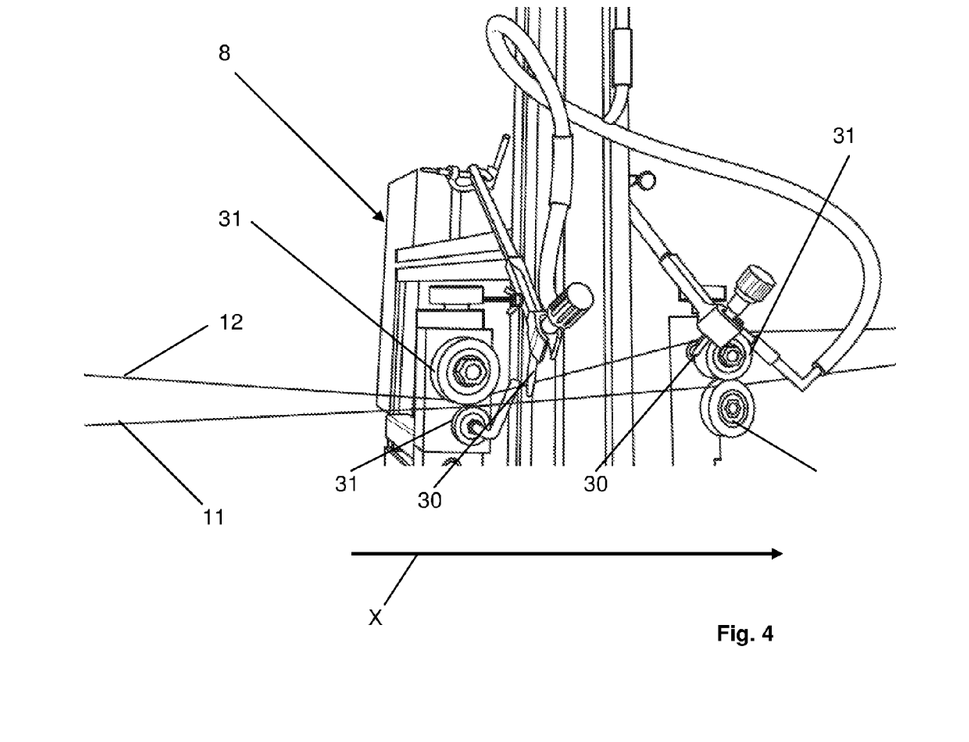
FIG. 4 is a perspective view of a portion of the system in FIG. 3.
Figure 5:
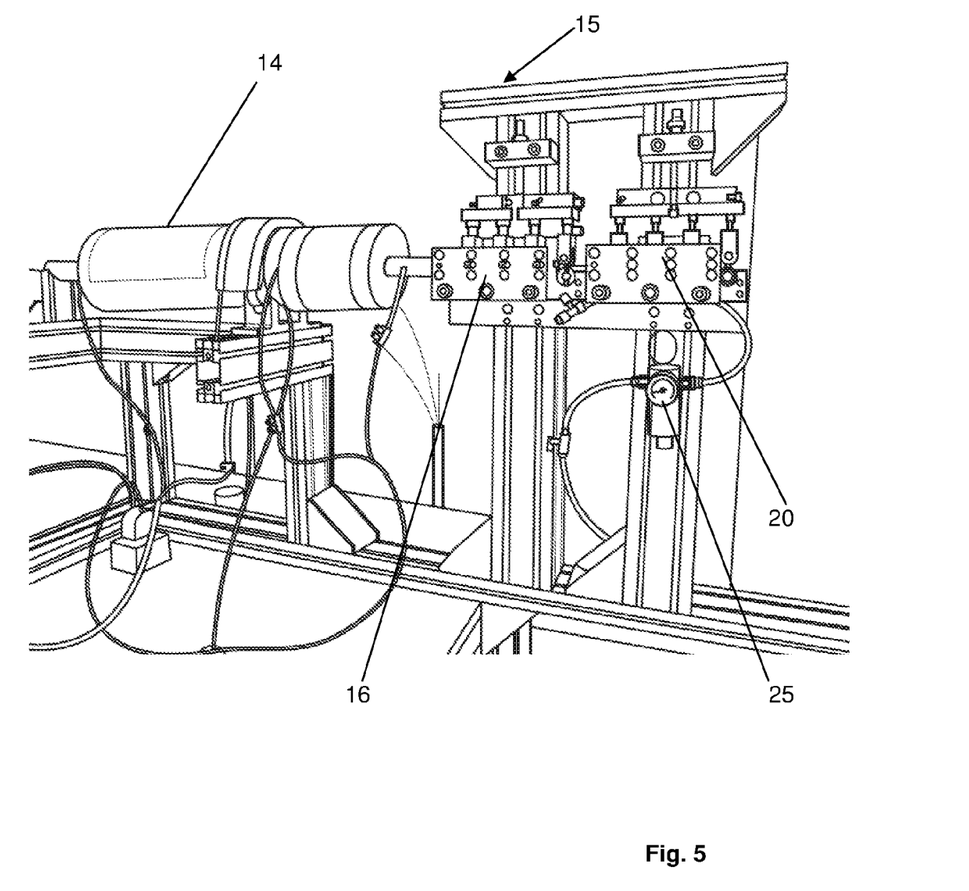
FIG. 5 is a perspective view of a second portion of the system in FIG. 3.
Figure 6:
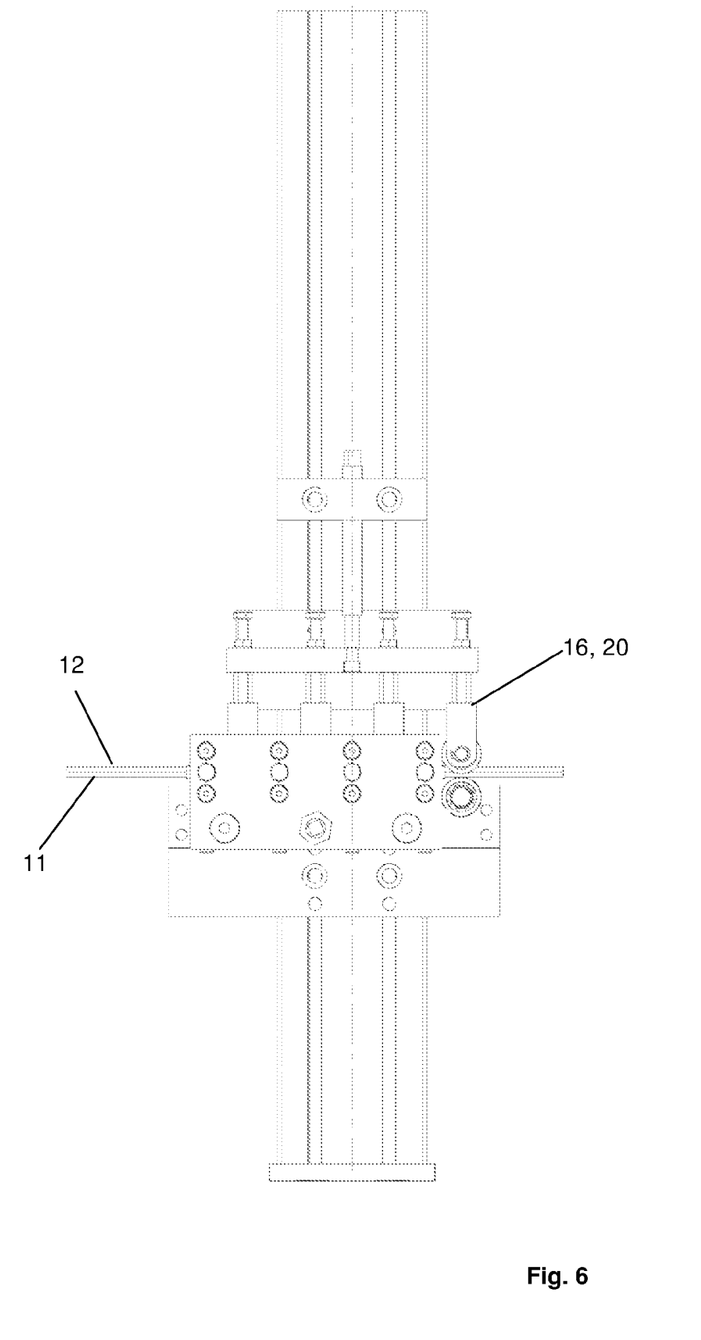
FIG. 6 is a front view of a detail in FIG. 5.
Figure 7:
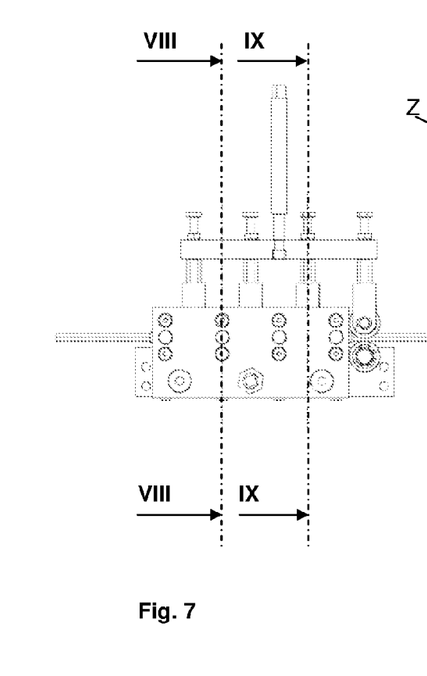
FIG. 7 is a front view of an enlarged detail of the part in FIG. 5.
Figure 8:
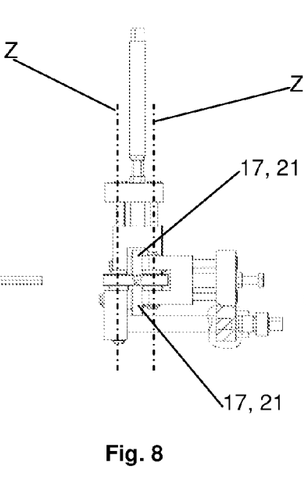
FIG. 8 is a section view of the component in FIG. 7 taken along section line VIII-VIII.
Figure 9:
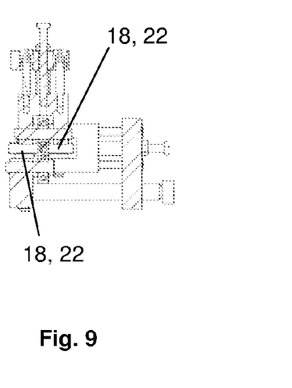
FIG. 9 is a section view of the component in FIG. 7 taken along section line IX-IX.
Figure 10:
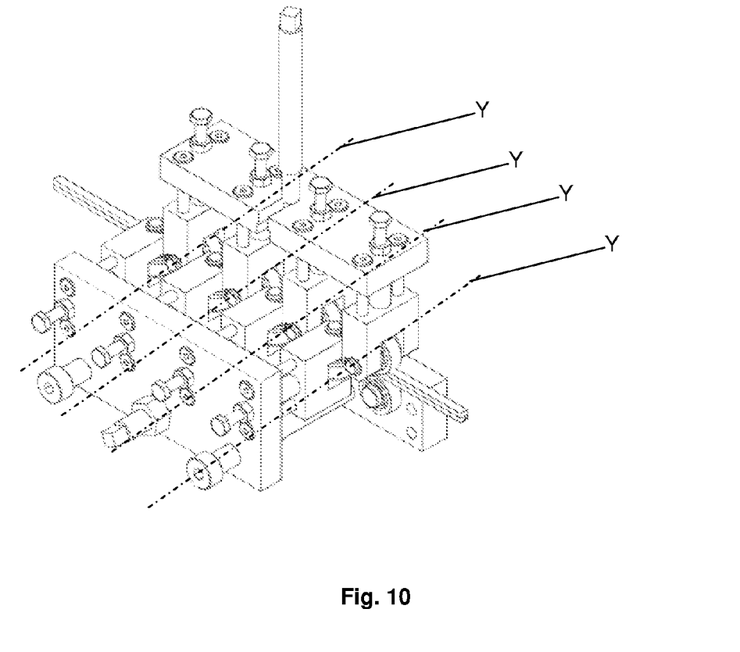
FIG. 10 is an axonometric top view of the component in FIG. 7.

Initially in FIGS. 1 and 2, an armored superconductor wire is indicated by reference numeral 10 (FIG. 1) or reference numeral 10a (FIG. 2) as a whole.

The armored superconductor wire 10, 10a has a rectangular section and comprises a superconductor portion 11 and at least one conductor portion 12.

The superconductor portion 11 consists of a rectangular section superconductor wire. For example, in the variants shown in FIGS. 1 and 2, the superconductor wire 11 is a flat rectangular section wire made of magnesium diboride ($MgB_2$) with greater dimension W comprised between 2 and 4 mm and smaller dimension H comprised between 0.3 and 1.5 mm. The conductor portion 12 consists of a rectangular section conductor wire. For example, in the variants illustrated in FIGS. 1 and 2, the conductor wire 12 is a flat rectangular section copper wire having greater dimension W and smaller dimension comprised between 0.1 and 0.75 mm.

In order to construct the armored superconductor wire 10, 10a, the superconductor 11 and conductor 12 wires are arranged side-by-side in parallel so that the respective sections face each other along the greater dimension sides W and the respective smaller dimension sides are reciprocally aligned. The superconductor 11 and conductor 12 wires are joined to each other by means of a brazing alloy layer 13 interposed between them. In the variants shown in FIGS. 1 and 2, the layer 13 of brazing alloy consists of an eutectoid alloy for mild, low-temperature brazing, with section having greater dimension equal to W and smaller dimension typically comprised between 2% and 9% of the smaller dimension of the section of the conductor wire 12.

The armored superconductor wire 10 (FIG. 1) comprises only one conductor wire 12 and only one brazing alloy layer 13 arranged alongside a same side of the superconductor wire 11 with cross dimension equal to a W.

The armored superconductor wire 10a (FIG. 2) comprises two pairs of conductor wire 12 and a brazing alloy layer 13 arranged respectively alongside each side of cross dimension equal to W of the superconductor wire 11.

According to other possible variants of the invention (not shown), the conductor and superconductor wires have a section different from the rectangular one. In all cases, they are joined by means of one or more layers of brazing alloy.

In figures from 3 to 10, a brazing system for manufacturing the armored superconductor wire 10 is indicated by reference numeral 1 as a whole. The system 1 comprises a first feeder 5 of superconductor wire 11 and a second feeder 6 of conductor wire 12.

The first feeder 5 comprises a store of superconductor wire 11, usually consisting of a coil, from which the superconductor wire 11 is unwound and advanced according to a first axial direction X1 of the superconductor wire 11. Downstream of the first feeder 5, the superconductor wire 11 is passed in a forced circulation pickling tank 5b, which eliminates the possible surface impurities coming from the previous production processes. Subsequently, at the outlet of the pickling tank 5b, the superconductor wire 11 is rinsed in water and crosses a compressed air blower having the function of drier.

The second feeder 6 comprises a store of conductor wire 12, usually consisting of a coil, from which the conductor wire 12 is unwound and advanced according to a second axial direction X2 of the conductor wire 12. A brazing alloy layer 13 is applied on a first face 12a of the conductor wire 12, having a cross section equal to W.

Downstream of the pickling tank 5b and of the feeder 6, an aligning device 8 is provided for approaching the superconductor wire 11 to the first face 12a of the conductor wire 12, by means of a plurality of transmission rolls 31, so that such superconductor 11 and conductor 12 wires are aligned along a common axial advancement direction X. The alignment requires the respective sections of the superconductor 11 and conductor 12 wires to face the greater dimension W. In the alignment device 8, the superconductor 11 and conductor 12 wires are either placed in contact or, alternatively, there is a non-null distance between them in the direction orthogonal to the common axial advancement direction X.

In the case of the variant (not shown) of the system 1, which can be used for manufacturing the variant 10a of the armored superconductor wire, the superconductor wire 11 is aligned with two conductor wires 12, both provided with a respective brazing alloy layer 13 on a first face having cross section equal to W and facing towards the superconductor wire 11, in the aligning device.

In the aligning device 8, there are one or more nozzles 30 for wetting the face or the faces of the superconductor wire 11 intended to come into contact with the layer or layers of brazing alloy 13 with a deoxidizer liquid.

In the system shown in the accompanying figures (FIGS. 1 and 4), the superconductor wire 11 must be under the conductor wire 12 and, consequently, the nozzle 30 is active on the upper face of the superconductor wire 11, facing towards the brazing alloy layer 13 placed on the first face 12a of the conductor wire.

According to a different embodiment of the present invention (FIG. 1b is), the superconductor wire 11 is placed over the conductor wire 12.

The deoxidizer liquid allows to activate the surface of the superconductor wire 11 so as to permit the correct execution of the brazing operation.

According to variant embodiments, the nozzle 30 may be of the gravity type or of the pressure type or of yet other type also intrinsically known and conventional. In general, for the purposes of the present invention, the superconductor wire 11 must be effectively wet by the deoxidizer liquid so as to correctly activate its surface and permit the correct execution of the brazing operation.

Downstream of the aligning device 8, there is a furnace 14 for melting the brazing alloy layer 13. The furnace 14 is of tubular, electric resistor type, in which temperature is regulated to approximately 350° C. for melting the brazing alloy of the layer 13. The temperature is chosen as a function of the type of chosen brazing alloy and of the size of the superconductor wire and of the conductor wire.

Downstream of the furnace 14, there is a collimator 15 to permit the alignment between the superconductor 11 and conductor 12 wires with respect to two axes Y, Z orthogonal to the axial direction X and to facilitate the consolidation of the brazing alloy.

The collimator 15 comprises a first collimation group 16 including a first plurality of rolls 17 rotatable about respective first rotation axes Y orthogonal to the axial direction X so as to compress the superconductor 11 and conductor 12 wire assembly and the brazing alloy layer 13 in direction orthogonal to the first face 12a of the conductor wire 12, i.e. orthogonal to the sides of dimension W of the respective sectors by means of adjustable elastic elements, such as for example springs. The first collimation group 16 further comprises a second plurality of rolls 18 rotational about respective second rotation axes Z orthogonal to the axial direction X and the first rotation axes Y so as to compress the sides of the superconductor 11 and conductor 12 wire assembly and the molten brazing alloy layer 13. The second rotatable rolls 18 are also pushed against the superconductor 11 and conductor 12 wire assembly and the molten brazing alloy layer 13 by means of the action of adjustable elastic elements, such as for example springs. The compression along the sides occurs in a direction orthogonal to the sides of dimension H, i.e. according to a parallel to the first face 12a of the conductor wire 12 and orthogonal to the axial direction X.

In the embodiment example shown in accompanying FIGS. 3-10, each plurality of rolls 17, 18 consists of four pairs of rolls, the rolls of each pair being symmetrically arranged with respect to the superconductor 11 and conductor 12 wire assembly and of the molten brazing alloy layer 13.

The plurality of rolls 17, 18 are arranged reciprocally so that the pairs of rolls of each plurality alternate with the pairs of rolls of the other plurality.

In the example in accompanying FIGS. 3-10, the first pair of rolls active on the wires at the outlet of the furnace 14 consists of a pair of rolls 18 of the second plurality.

The rolls 17, 18 of the first collimation group 16 are coated with thermally insulating material which is also refractory to the brazing alloy to prevent the accumulation thereof, such as for example plastic or ceramic material.

Downstream of the first collimation group 16, there is a second collimation group 20 including a third plurality of rolls 21 arranged parallel to the first plurality of rolls 17 and having a similar function. Furthermore, the second collimation group 20 includes a fourth plurality of rolls 22 arranged parallel to the second plurality of rolls 18 and having a similar function. The rolls 21, 22 of the second collimation group 20 differ from the rolls 17, 18 of the first collimation group 16 in that they are coated with thermally conducting material, i.e. metal, to promote thermal dissipation.

The second collimation group 20 further includes cooling means 25, of the compressed air type, downstream of the plurality of rolls 21, 22 to remove heat from the superconductor 11 and conductor 12 wire assembly and the molten brazing alloy layer 13 and to obtain the solidification of the brazing alloy layer 13, so that the finished product constituted by the armored superconductor wire 10 is obtained at the outlet of the second collimation group 20.

According to respective variants of the present invention, either one or both of the collimation groups 16, 20 includes a device for removing the brazing alloy in excess provided with elements active along the sides of the superconductor 11 and conductor 12 wires. Such a device for removing the brazing alloy in excess is made by means of hot filiform elements sliding along the sides of the wires 11,12 or rotating abrasive brushes active along the sides of the wires 11, 12.

Downstream of the second collimation group 20, there is a motorized track drive system 32 for moving the superconductor 11 and conductor 12 wires and the armored superconductor wire 10 along the axial direction X.

Downstream of the drive system 32, there is a measuring system 33 for measuring the dimensions of the armored superconductor wire 10 orthogonal to the axial direction X.

Finally, downstream of the measuring system 33, there is a motorized winder for winding the armored superconductor wire 10 on a supporting coil.

The present invention further relates to a manufacturing process of a superconductor wire 10, 10a comprising the steps of moving a semiconductor wire 11 according to a first axial direction X1, moving a conductor wire 12 according to a second axial direction X2, a layer 13 of brazing alloy having been applied to a first face of the conductor wire. According to a first variant of the process, two conductor wires 12 provided with respective brazing alloy layer 13 are moved;

approaching the superconductor wire 11 to the first face 12a of the conductor wire 12 (or of the conductor wires 12, in the case of the first variant mentioned above), so that the superconductor 11 and conductor 12 wires are aligned along a common axial direction X, melting the brazing alloy layer 13, for example by means of an electric resistor tubular furnace 14, compressing the bases, i.e. the faces parallel to the brazing alloy layer 13, of the superconductor 11 and conductor 12 wire assembly and of the molten brazing alloy layer 13 according to a direction orthogonal to the first face 12a, compressing the sides of the superconductor 11 and conductor 12 wire assembly and of the molten brazing alloy layer 13 parallel to the first face 12a of the conductor wire 12 and orthogonal to the longitudinal direction X, repeating the aforesaid steps of compressing the bases and compressing the sides;

cooling the superconductor 11 and conductor 12 wire assembly and the molten brazing alloy layer 13 to obtain the solidification of the brazing alloy layer 13.

At the end of the process described above, the end product constituted by the superconductor wire 10, 10a is obtained after the complete solidification of the brazing alloy layer 13.

The invention claimed is:

1. A brazing system for manufacturing an armored superconductor wire comprising a first superconductor portion and at least one second conductor portion, said system comprising:
   a first feeder of a superconductor wire,
   a second feeder of a conductor wire, a layer of brazing alloy being applied to a first face of said conductor wire,
   an aligning device for approaching said superconductor wire to said first face of said conductor wire, so that said superconductor wires and conductor are aligned along a common axial direction,
   a furnace for melting said brazing alloy layer,
   a collimator comprising:
   at least one first plurality of rolls rotatable about respective first rotation axes orthogonal to said axial direction to compress said superconductor and conductor wire assembly and said layer of molten brazing alloy in direction orthogonal to said first face of said conductor wire,
   at least one second plurality of rolls rotatable about respective first rotation axes orthogonal to said axial direction and to said first rotation axes to compress the sides of said superconductor and conductor wire assembly and said layer of molten brazing alloy in direction parallel to said first face of said conductor wire and orthogonal to axial direction,
   cooling means downstream of said plurality of rolls to remove heat from said superconductor and conductor wire assembly and said molten brazing alloy layer to obtain the solidification of said brazing alloy layer.

2. The brazing system according to claim 1, wherein said collimator comprises:
   a first collimation group including said first and second plurality of rolls,
   a second collimation group downstream of said first collimation assembly including:
   a third plurality of rolls arranged parallel to said first plurality of rolls to compress the superconductor and conductor wire assembly and said layer of molten brazing alloy in direction orthogonal to said first face of said conductor wire,
   a fourth plurality of rolls arranged parallel to said second plurality of rolls to compress the sides of said superconductor and conductor wire assembly and of said layer of molten brazing alloy in direction parallel to said first face of said conductor wire and orthogonal to said axial direction,
   said cooling means.

3. The brazing system according to claim 1, wherein said cooling means are of the air type.

4. The brazing system according to claim 1, wherein said rolls of said first and second plurality are coated with thermally insulating material and said rolls of said third and fourth plurality are coated with thermally conducting material.

5. The brazing system according to claim 1, wherein a drive system is provided downstream of said cooling means for moving said superconductor and conductor wires along said axial direction.

6. The brazing system according to claim 5, wherein a measuring system is provided downstream of said drive system to measure the dimensions of said armored superconductor wire orthogonal to said axial direction.

7. The brazing system according to claim 1, wherein said collimator includes a device for removing the brazing alloy in excess provided with active elements along the sides of said superconductor and conductor wires.

8. The brazing system according to claim 7, wherein said device for removing the brazing alloy in excess comprises sliding filiform elements or abrasive rotating elements.

9. The brazing system according to claim 1, wherein a pickling tank for said superconductor wire is provided downstream of said first feeder.

* * * * *